United States Patent
Smith

(10) Patent No.: US 9,966,294 B2
(45) Date of Patent: May 8, 2018

(54) MOBILE ELECTROSTATIC CARRIER FOR A SEMICONDUCTIVE WAFER AND A METHOD OF USING THEREOF FOR SINGULATION OF THE SEMICONDUCTIVE WAFER

(71) Applicant: Eryn Smith, Pleasanton, CA (US)

(72) Inventor: Eryn Smith, Pleasanton, CA (US)

(73) Assignee: DIABLO CAPITAL, INC., Reno, NV (US)

( * ) Notice: Subject to any disclaimer, the term of this patent is extended or adjusted under 35 U.S.C. 154(b) by 382 days.

(21) Appl. No.: 14/717,839

(22) Filed: May 20, 2015

(65) Prior Publication Data

US 2015/0255320 A1 Sep. 10, 2015

Related U.S. Application Data

(63) Continuation-in-part of application No. 14/538,183, filed on Nov. 11, 2014, now Pat. No. 9,754,809.

(60) Provisional application No. 62/001,503, filed on May 21, 2014, provisional application No. 61/902,591, filed on Nov. 11, 2013.

(51) Int. Cl.
| | |
|---|---|
| *H01L 21/02* | (2006.01) |
| *H01L 21/683* | (2006.01) |
| *H01L 21/78* | (2006.01) |
| *H01L 21/3065* | (2006.01) |

(52) U.S. Cl.
CPC ...... *H01L 21/6835* (2013.01); *H01L 21/3065* (2013.01); *H01L 21/6833* (2013.01); *H01L 21/78* (2013.01); *H01L 2221/68327* (2013.01); *H01L 2221/68381* (2013.01); *Y10T 156/1062* (2015.01); *Y10T 156/1064* (2015.01)

(58) Field of Classification Search
CPC ............. H01L 21/6835; H01L 21/3065; H01L 21/6833; H01L 21/78; Y10T 156/1062; Y10T 156/1064

See application file for complete search history.

(56) References Cited

U.S. PATENT DOCUMENTS

| | | | | |
|---|---|---|---|---|
| 5,793,192 | A * | 8/1998 | Kubly | ................. H01L 21/6833 279/128 |
| 2010/0129987 | A1* | 5/2010 | Kamiya | .................... B32B 7/12 438/464 |

* cited by examiner

*Primary Examiner* — Linda L Gray

(57) ABSTRACT

A mobile electrostatic carrier (MESC) provides a structural platform to temporarily bond a semiconductive wafer and can be used to transport the semiconductive wafer or be used to perform manufacturing processes on the semiconductive wafer. The MESC uses a plurality of electrostatic field generating (EFG) circuits to generate electrostatic fields across the MESC that allow the MESC to bond to compositional impurities within the semiconductive process. The MESC is particularly useful during singulation for a wafer fabrication process. The MESC holds the semiconductive wafer in a constant position as the semiconductive wafer is cut into a plurality of dies. Once the MESC is discharges its EFG circuits and consequently dissipates its bonding electrostatic fields, the plurality of dies can be easily and readily removed from the MESC.

6 Claims, 6 Drawing Sheets

US 9,966,294 B2

MOBILE ELECTROSTATIC CARRIER FOR A SEMICONDUCTIVE WAFER AND A METHOD OF USING THEREOF FOR SINGULATION OF THE SEMICONDUCTIVE WAFER

The current application claims priority to a provisional application 62/001,503 filed on May 21, 2014.

The current application is a continuation-in-part and claims priority to a non-provisional application Ser. No. 14/538,183 filed on Nov. 11, 2014. The non-provisional application Ser. No. 14/538,183 claims priority to a provisional application 61/902,591 filed on Nov. 11, 2013.

FIELD OF THE INVENTION

The present invention relates generally to a method of using a mobile electrostatic carrier (MESC) for device singulation. More specifically, the present invention is a method of using the MESC in combination with a deep trench etching process in order to singulate individual pieces or individual devices from the semiconductor wafer as a whole.

BACKGROUND OF THE INVENTION

With the advent of new technology, people are more reliant on electronic devices and systems in their daily routine. This causes an increase in manufacturing and producing of these electronic devices and systems. In addition, the manufacturing of smaller and smaller end user products has driven semiconductor manufactures to continually decrease the size and the power consumption of semiconductors devices, which has created a variety of challenges to the manufacturer. Currently, these semiconductor devices are singulated from a whole wafer by processes involving diamond saw technology, well known in the art of wafer fabrication. Dicing tapes have also helped to speed up the throughput and the cost effectiveness of singulation, but the downside to dicing tapes is that a die could be difficult to remove from the dicing tape or that the residue from the dicing tape can be hard to remove or clean off of a die. Thus, there is no cost effective and highly yielding technology that allows for a semiconductive wafer to be cut into a plurality of dies.

An objective of the present invention is to utilize a mobile electrostatic carrier (MESC) during singulation of the wafer fabrication process. The MESC is able to hold and to gently release thin semiconductive substrates and does not require extra steps to clean. The MESC is an electrostatic temporary bond technology that provides a rigid contamination-free handling solution for fragile non-standard substrates and small devices without the need for fasteners or adhesives. In addition, the MESC is able to carry these thin semiconductive substrates without permanent connections to an external power supply, vacuum supply, or mechanical clamping assembly. The MESC is able to bond so strongly to a thin semiconductive substrate that the MESC can hold onto the thin semiconductive substrate during different manufacturing processes with large sheer forces such as grinding or singulation.

In order to address the aforementioned problem with the current technology used during singulation of the wafer fabrication process, the MESC is used to mount a semiconductive wafer so that the semiconductive wafer is properly held in place while being cut into a plurality of dies by some means known in the art. Once the semiconductive wafer is separated into the plurality of dies, the MESC can be transported to a different location with the individual dies still firmly attached to MESC. When the electrostatic bond is discharged by the MESC, the individual dies can be readily and easily removed from the MESC.

DETAILED DESCRIPTION OF THE INVENTION

All illustrations of the drawings are for the purpose of describing selected versions of the present invention and are not intended to limit the scope of the present invention.

Figure 1:
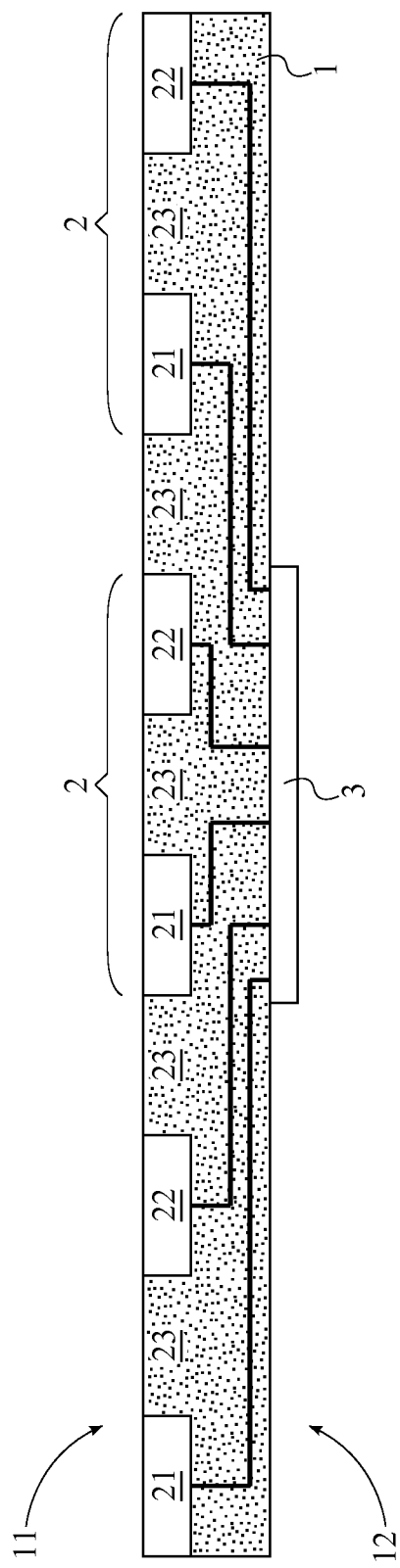
FIG. 1 is a schematic view of the major components of a mobile electrostatic carrier (MESC).
Figure 4:
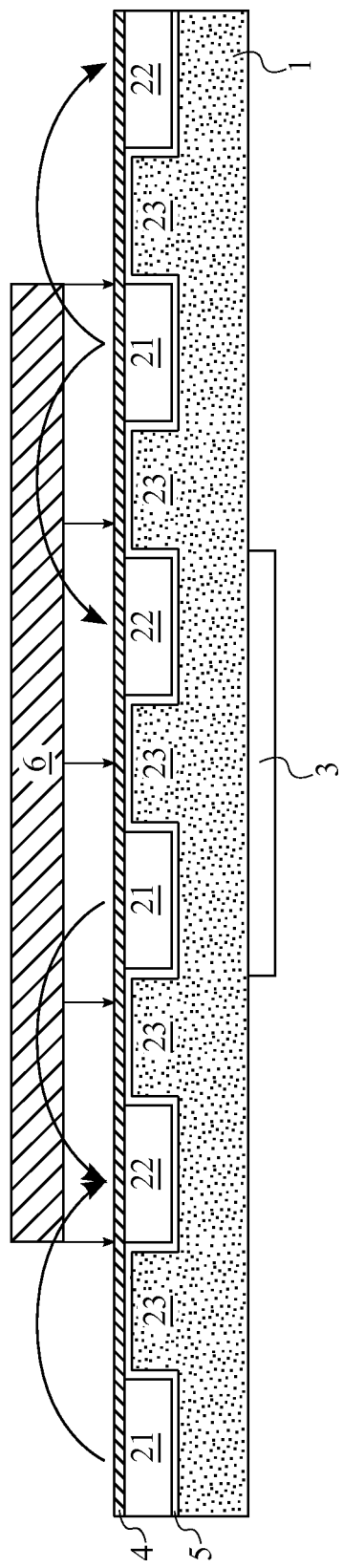
FIG. 4 is a schematic view of the MESC implementing an electrostatic field to bond a semiconductive wafer to the MESC.
Figure 5:
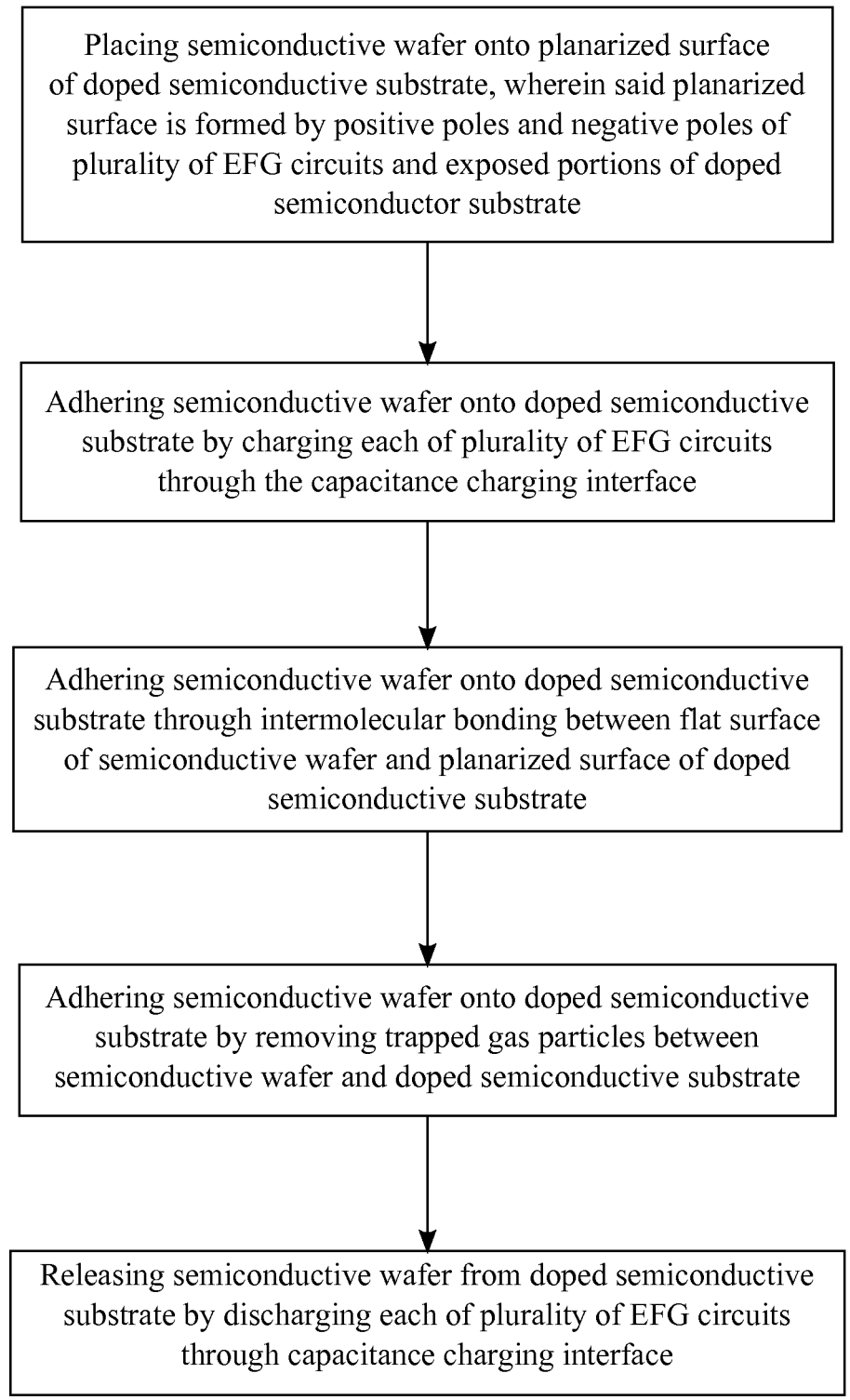
FIG. 5 is a flowchart illustrating how three modes of adhesion are used to bond the semiconductive wafer to the MESC.

As can be seen in FIGS. 1 and 4, the present invention is a mobile electrostatic carrier (MESC) that is used to handle and transport semiconductive wafers or coupons because of the thin, flimsy nature of these wafers or coupons. Three different modes of adhesion are used to hold a semiconductive wafer upon the present invention, which outlined in FIG. 5. In addition, the present invention can be used to bond and carry many different sizes of semiconductive wafers or coupons. The MESC comprises a doped semiconductive substrate 1, a plurality of electrostatic field generating (EFG) circuits 2, and a capacitance charging interface 3. The doped semiconductive substrate 1 is used as a base to connect the other components of the present invention together and allows for a semiconductive wafer 6 to be properly situated upon the present invention. The doped semiconductive substrate 1 is either made of a p-type semiconductor material or an n-type semiconductor material that is used in combination with the plurality of EFG circuits 2 in order to generate a non-uniform electrostatic field, which is used to bond the semiconductive wafer 6 to the present invention. The plurality of EFG circuits 2 is distributed across the doped semiconductive substrate 1 so that a semiconductive wafer 6 can be adhered anywhere across the doped semiconductive substrate 1. The capacitance charging interface 3 is used to selectively charge or discharge the doped semiconductive substrate 1 and the plurality of EFG circuits 2. Essentially, the capacitance charging interface 3 is used to turn on or to turn off the non-uniform electrostatic field.

One mode of adhesion implemented by the present invention is the non-uniform electrostatic field that is generated by the plurality of EFG circuits 2. Each of the plurality of EFG circuits 2 comprises a positive pole 21, a negative pole 22, and a biased pole 23. The positive pole 21 and the negative pole 22 are antennas that are respectively provided with a positive charge and a negative charge, which generates an electrostatic field from the positive pole 21 to the negative pole 22. These antennas are designed to be highly resistive so that each antenna is able to hold a larger charge and, thus, is able to increase the capacitance between the positive pole 21 and the negative pole 22. The electrostatic field generated by each of the plurality of EFG circuits 2 will be used to hold a semiconductive wafer 6 on the doped semiconductive substrate 1. For the present invention, the plurality of EFG circuits 2 will apply a greater bonding energy on materials with a lower resistivity. Conceptually, materials with a lower resistivity have more impurities, and the electrostatic field lines emanating from the plurality of EFG circuits 2 can more easily grasp onto these impurities. For example, semiconductive materials such as aluminum have a relatively large amount of impurities, and, thus, the plurality of EFG circuits 2 can more easily bond with aluminum. However, pure materials such as quartz, sapphire, or diamond have a relatively small amount of impurities, and, thus, the plurality of EFG circuits 2 cannot easily bond to these pure materials.

When a semiconductive wafer 6 is being held by the present invention, the semiconductive wafer 6 is situated upon a first face 11 of the doped semiconductive substrate 1. Consequently, the positive pole 21 and the negative pole 22 are embedded in the doped semiconductive substrate 1 from the first face 11 so that the electrostatic field produced by the positive pole 21 and the negative pole 22 can interact with the semiconductive wafer 6. The positive pole 21 and the negative pole 22 are offset from each other across the first face 11 by a specified gap, which spans across an exposed portion of the doped semiconductive substrate 1. The exposed portion is used as the biased pole 23 for each of the plurality of EFG circuits 2. Moreover, the bonding strength of the electrostatic field is proportionately dependent on the capacitance between the positive pole 21 and the negative pole 22. The present invention can increase the capacitance between the positive pole 21 and the negative pole 22 by using the doped semiconductive substrate 1 itself and the biased pole 23, and, thus, the present invention can increase the bonding strength of the electrostatic field. When the biased pole 23 is either positively or negatively charged by the capacitance charging interface 3, the doped semiconductor substrate produces an enrichment or depletion zone within the semiconductive wafer 6, each of which is located adjacent to the biased pole 23 and is located in between the positive pole 21 and the negative pole 22. The location of the enrichment or depletion zone allows the present invention to adjust the capacitance between the positive pole 21 and the negative pole 22. Thus, the present invention can adjust the dielectric properties of the semiconductive wafer 6 through the creation of the enrichment or depletion zone. For example, the enrichment or depletion zone can be used to increase the dielectric constant and, in turn, increase the capacitance between the positive pole 21 and the negative pole 22. This increase in capacitance between the positive pole 21 and the negative pole 22 creates a stronger bonding force between the semiconductive wafer 6 and the present invention.

Figure 3:
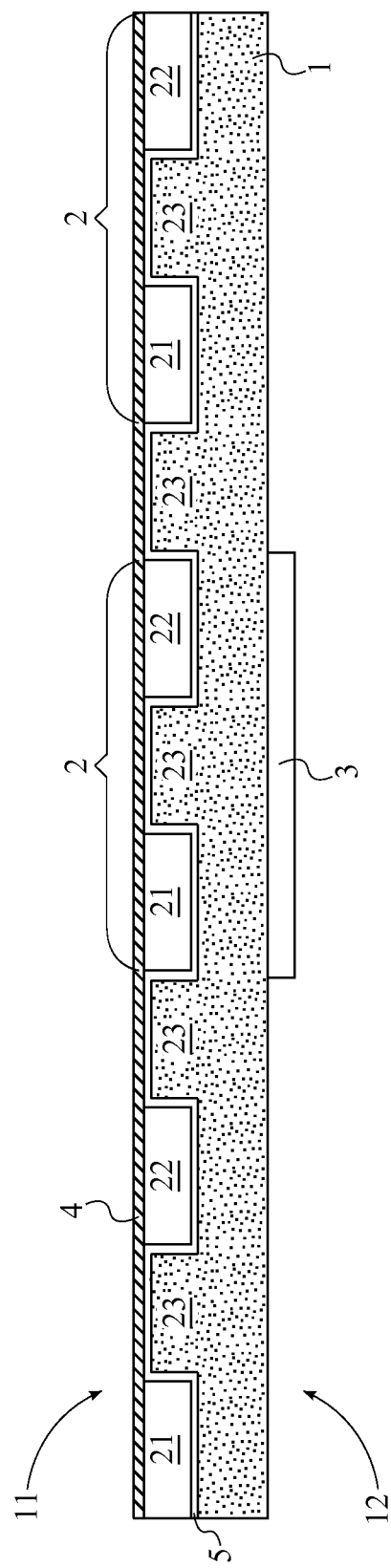
FIG. 3 is a schematic view of the MESC with the insulative film and the polishing film.

The size of the specified gap between the positive pole 21 and the negative pole 22 is determined by two factors: the size of semiconductive wafers being carried by the present invention and the operational voltage range of the present invention. The size of the semiconductive wafers determines the size of the specified gap because the present invention can grasp a smaller semiconductive wafer with a smaller specified gap between the positive pole 21 and the negative pole 22. However, a smaller specified gap would more likely cause a corona discharge between the positive pole 21 and the negative pole 22. The operational voltage range of the present invention also determines the size of the specified gap because the present invention can more securely grasp a semiconductive wafer with a higher operational voltage range. However, a higher operational voltage range would more likely cause a corona discharge between the positive pole 21 and the negative pole 22. The present invention should be designed to adequately grasp the semiconductive wafers without causing a corona discharge by selecting the appropriate size for the specified gap and by selecting the appropriate operational voltage for the present invention. Thus, the appropriate size for the specified gap and the appropriate operational voltage are also chosen to accommodate a specific size or kind of semiconductive wafer. In addition, an insulative film 5 shown in FIG. 3 is positioned between the positive pole 21 and the doped semiconductive substrate 1 and is positioned between the negative pole 22 and the doped semiconductive substrate 1, which prevents an electrical current from passing from the negative pole 22, through an exposed portion of the doped semiconductive substrate 1, and to the positive pole 21. In one embodiment of the present invention, the doped semiconductive substrate 1 is made of silicon, which is oxidized on the outer surface in order to form the insulative film 5.

A second mode of adhesion implemented by the present invention is a dipole-dipole bonding between flat surfaces of the present invention and the semiconductive wafer 6. In order to implement this mode of adhesion for the present invention, the positive poles 21 and the negative poles 22 need to be flush with the exposed portions of the doped semiconductive substrate 1. Consequently, a planarized surface is formed by the positive poles 21 and the negative poles 22 of the plurality of EFG circuits 2 and the exposed portions of the doped semiconductive substrate 1. This kind of intermolecular bonding needs to occur between the planarized surface of the doped semiconductive substrate 1 and a flat surface of the semiconductive wafer 6. In addition, a polishing film 4 shown in FIG. 3 is superimposed upon the planarized surface in order to enhance the dipole-dipole bonding between the present invention and the semiconductive wafer 6. The polishing film 4 is also used as an insulator that further prevents corona discharge from the positive pole 21 to the negative pole 22.

A third mode of adhesion implemented by the present invention is to removing trapped gas particles between the semiconductive wafer 6 and the doped semiconductive substrate 1 in order to form a better intermolecular bond between the planarized surface of the doped semiconductive substrate 1 and a flat surface of the semiconductive wafer 6. In order to implement this mode of adhesion for the present invention, the semiconductive wafer 6 is bonded to the present invention placed into a kind of vacuum chamber. Once the vacuum chamber is activated, the trapped gas particles are exhausted from the space between the semiconductive wafer 6 and the doped semiconductive substrate 1.

Figure 2:
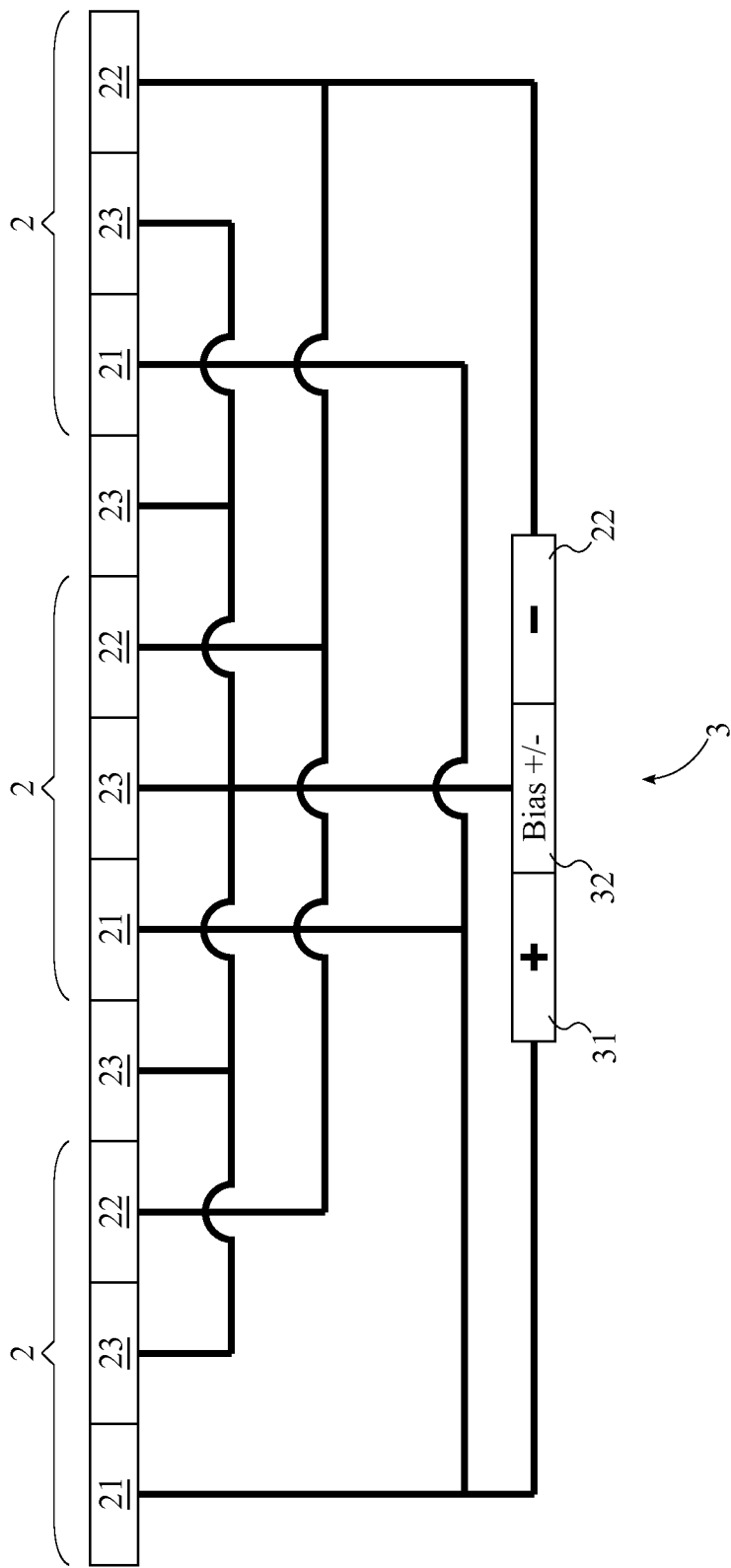
FIG. 2 is a diagram illustrating the electrical connections between the electrostatic field generating circuits and the capacitance charging interface for the MESC.

As can be seen in FIG. 2, the capacitance charging interface 3 is used to selectively charge or discharge the plurality of EFG circuits 2 by adding or depleting the positive pole 21 and the negative pole 22 of their respective electrical charges. The capacitance charging interface 3 will charge the plurality of EFG circuits 2 if the semiconductive wafer 6 needs to be bonded to the present invention. The capacitance charging interface 3 will also discharge the plurality of EFG circuits 2 if the semiconductive wafer 6 needs to be released from the present invention. The capacitance charging interface 3 comprises at least one positive terminal 31, at least one negative terminal 32, and at least one biasing terminal 32, all of which are mounted onto a second face 12 of the doped semiconductive substrate 1. This allows a temporary electrical connection to be made with the capacitance charging interface 3 from the bottom of the present invention while the semiconductive wafer 6 is held on the top of the present invention. The at least one positive terminal 31 is electrically connected to the positive poles 21 of the plurality of EFG circuits 2 so that electrical current can flow from the positive poles 21 to the capacitance charging interface 3 while charging the plurality of EFG circuits 2 and can flow from the capacitance charging interface 3 to the positive poles 21 while discharging the plurality of EFG circuits 2. Similarly, the at least one negative terminal 32 is electrically connected to the negative poles 22 of the plurality of EFG circuits 2 so that electrical current can flow from the capacitance charging interface 3 to the negative poles 22 while charging the plurality of EFG circuits 2 and can flow from the negative poles 22 to the capacitance charging interface 3 while discharging the plurality of EFG circuits 2. In addition, the at least one biasing terminal 32 is electrically connected to the biased pole 23 in order to allow electrical current to flow through the doped semiconductive substrate 1. In the preferred embodiment of the present invention, the at least one positive terminal 31, at least one negative terminal 32, and at least one biasing terminal 32 are mounted onto the second surface 12 of the doped semiconductive substrate 1 so that the capacitance charging interface 3 does not interfere with the positioning of the semiconductive wafer 6 on the first face 11 of the doped semiconductive substrate 1.

Figure 6:
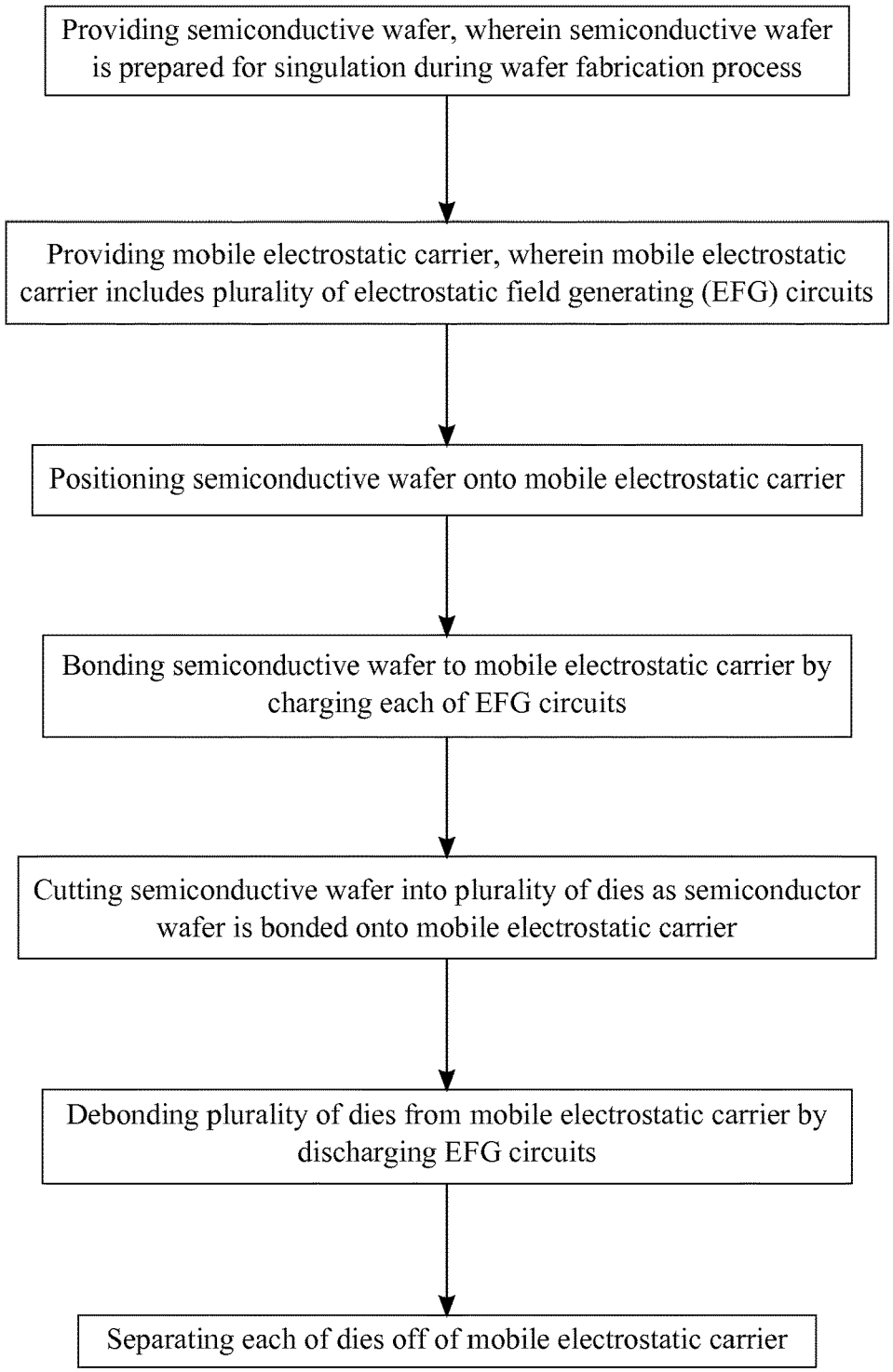
FIG. 6 is a flowchart illustrating how the MESC is used for singulation of a semiconductive wafer during a wafer fabrication process.

The present invention can also be used to make the wafer fabrication process more efficient during singulation of a semiconductive wafer. Typically before singulation, an integrated circuit is copied and fabricated a number of times on a single piece of semiconductive wafer. Once a semiconductive wafer is prepared for singulation during the wafer fabrication process, the semiconductive wafer and the present invention are processed through the following steps, which are illustrated in FIG. 6. To begin, the semiconductive wafer is positioned onto the present invention in order to properly orient the semiconductive wafer for singulation. The semiconductive wafer is also bonded to the present invention by charging each of the plurality of EFG circuits 2, which holds the semiconductive wafer in place for singulation. These preliminary steps are completed so that the semiconductive wafer can be accurately and precisely cut into a plurality of dies, each of which is manufactured to be an individually functioning integrated circuit on a fractional piece of the semiconductive wafer. The plurality of dies is then debonded from the present invention by discharging the plurality of EFG circuits 2. This allows the plurality of dies to be loosely held on the present invention and consequently allows the plurality of dies to be separated from the present invention, which completes singulation during the wafer fabrication process. Once the present invention discharges the plurality of EFG circuits 2, a pick-and-place machine can typically be used pluck the plurality of dies of off the present invention. Other means common to the art of wafer fabrication can be implemented to separate the plurality of dies from the present invention.

The singulation of a semiconductive wafer is preferably accomplished by means of an etching tool in order to smoothly cut the semiconductive wafer into the plurality of dies. The etching tool is used to secure the present invention in place, which allows the positioning of the semiconductive wafer to remain constant during the mechanical cutting motions of the etching tool. The mechanical cutting motions of the etching tool are then used to etch a trench pattern into the semiconductive wafer so that the trench pattern delineates the divisions amongst the plurality of dies. Deep trenches within the semiconductive wafer is required for singulation, and, thus, the etching tool should be configured for deep reactive-ion etching.

The singulation of a semiconductive wafer requires only the primary mode of adhesion from the present invention, which is to use the electrostatic fields generated by the plurality of EFG circuits 2 to bond to the compositional impurities within the semiconductive wafer. The other modes of adhesion implemented by the present invention (such as intermolecular bonding between flat surfaces and removing trapped gas particles) can be done to further bond the semiconductive wafer to the present invention, but the other modes of adhesion are not necessary for the singulation of the semiconductive wafer.

Although the invention has been explained in relation to its preferred embodiment, it is to be understood that many other possible modifications and variations can be made without departing from the spirit and scope of the invention as hereinafter claimed.

What is claimed is:

1. A method of using a mobile electrostatic carrier for singulation of a semiconductive wafer, the method comprises the steps of:
    providing said semiconductive wafer, wherein said semiconductive wafer is prepared for singulation during a wafer fabrication process;
    providing said mobile electrostatic carrier, wherein said mobile electrostatic carrier includes a plurality of electrostatic field generating (EFG) circuits;
    positioning said semiconductive wafer onto said mobile electrostatic carrier;
    bonding said semiconductive wafer to said mobile electrostatic carrier by charging each of said plurality of EFG circuits;
    cutting said semiconductive wafer into a plurality of dies as said semiconductor wafer is bonded onto said mobile electrostatic carrier;
    debonding said plurality of dies from said mobile electrostatic carrier by discharging said plurality of EFG circuits; and
    separating each of said plurality of dies off of said mobile electrostatic carrier.

2. The method of using a mobile electrostatic carrier for singulation of a semiconductive wafer, the method as claimed in claim 1 comprises the steps of:
    providing an etching tool in order to cut said semiconductive wafer into said plurality of dies;
    securing said mobile electrostatic carrier in place with said etching tool; and
    etching a trench pattern into said semiconductive wafer with said etching tool as said mobile electrostatic carrier is secured in place by said etching tool, wherein said trench pattern delineates said plurality of dies.

3. The method of using a mobile electrostatic carrier for singulation of a semiconductive wafer, the method as claimed in claim 2, wherein said etching tool is configured for deep reactive-ion etching.

4. The method of using a mobile electrostatic carrier for singulation of a semiconductive wafer, the method as claimed in claim 1, a pick-and-place machine separates each of said plurality of dies from said mobile electrostatic carrier.

5. The method of using a mobile electrostatic carrier for singulation of a semiconductive wafer, the method as claimed in claim 1 comprises the steps of:
- providing a positive pole and a negative pole for each of said plurality of EFG circuits;
- positively charging said positive pole for each of the plurality of EFG circuits;
- negatively charging said negative pole for each of the plurality of EFG circuits; and
- producing an electrostatic field between said positive pole and said negative pole for each of said plurality of EFG circuits, wherein said electrostatic field bonds to compositional impurities within said semiconductive wafer.

6. The method of using a mobile electrostatic carrier for singulation of a semiconductive wafer, the method as claimed in claim 1 comprises the steps of:
- wherein a polishing film is superimposed upon a planarized surface of said mobile electrostatic carrier; and
- bonding said semiconductive wafer onto said mobile electrostatic carrier through intermolecular bonding between a flat surface of said semiconductive wafer and said polishing film of said mobile electrostatic carrier.

* * * * *